(12) United States Patent
Christiansen et al.

(10) Patent No.: US 10,109,599 B2
(45) Date of Patent: Oct. 23, 2018

(54) INTEGRATED CIRCUIT STRUCTURE WITH CONTINUOUS METAL CRACK STOP

(71) Applicant: GLOBALFOUNDRIES Inc., Grand Cayman (KY)

(72) Inventors: Cathryn J. Christiansen, Huntington, VT (US); Anthony K. Stamper, Burlington, VT (US); Tom C. Lee, Essex Junction, VT (US); Ian Mccallum-Cook, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 19 days.

(21) Appl. No.: 15/387,120

(22) Filed: Dec. 21, 2016

(65) Prior Publication Data
US 2018/0174982 A1 Jun. 21, 2018

(51) Int. Cl.
*H01L 29/45* (2006.01)
*H01L 23/00* (2006.01)
*H01L 23/522* (2006.01)
*H01L 23/532* (2006.01)

(52) U.S. Cl.
CPC ........ *H01L 23/562* (2013.01); *H01L 23/5226* (2013.01); *H01L 23/53257* (2013.01); *H01L 29/45* (2013.01)

(58) Field of Classification Search
CPC ............... H01L 23/562; H01L 23/5226; H01L 23/53257; H01L 29/45
See application file for complete search history.

(56) References Cited

U.S. PATENT DOCUMENTS

| | | | |
|---|---|---|---|
| 5,945,716 A * | 8/1999 | Iwasaki | H01L 21/78 257/382 |
| 7,335,577 B2 | 2/2008 | Daubenspeck et al. | |
| 7,521,336 B2 | 4/2009 | Daubenspeck et al. | |
| 7,572,738 B2 | 8/2009 | Nogami | |
| 8,610,238 B2 | 12/2013 | Kaltalioglu et al. | |
| 2005/0026397 A1* | 2/2005 | Daubenspeck | H01L 21/31111 438/465 |

(Continued)

FOREIGN PATENT DOCUMENTS

WO 2005013330 A2 2/2005

*Primary Examiner* — Whitney T Moore
*Assistant Examiner* — Joseph Galvin, III
(74) *Attorney, Agent, or Firm* — Yuanmin Cai; Hoffman Warnick LLC

(57) ABSTRACT

An integrated circuit (IC) structure is disclosed. The structure can include: an insulator positioned over a device layer; a capping layer positioned over the insulator; an inter-layer dielectric (ILD) positioned over the capping layer; a first metal wire positioned over the ILD, and outside an active area of the IC structure; a continuous metal crack stop in contact with, and interposed between, the first metal wire and the device layer, such that the continuous metal crack stop extends through at least the insulator, the capping layer, and the ILD; a second metal wire positioned over the ILD, and within the active area of the IC structure; and two vias vertically coupled to each other and interposed between the second metal wire and the device layer, such that the two vias extend through at least the insulator, the capping layer, and the ILD.

20 Claims, 7 Drawing Sheets

(56) References Cited

U.S. PATENT DOCUMENTS

| | | | |
|---|---|---|---|
| 2009/0102059 A1* | 4/2009 | Ishii | H01L 23/5226 257/774 |
| 2010/0200958 A1* | 8/2010 | Angyal | H01L 23/562 257/619 |
| 2013/0187280 A1* | 7/2013 | Yuan | H01L 23/585 257/773 |

* cited by examiner

INTEGRATED CIRCUIT STRUCTURE WITH CONTINUOUS METAL CRACK STOP

BACKGROUND

Technical Field

Aspects of the disclosure relate generally to integrated circuits (ICs). More specifically, embodiments of the present disclosure include an IC structure with a metal crack stop therein, as well as associated and/or alternative structural elements therein.

Related Art

Each IC of a particular device can be made up of billions of interconnected devices, such as transistors, resistors, capacitors, and diodes, located on one or more chips of semiconductor substrate material. The quality and viability of a product including an IC therein can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to and including the formation of a first "metal layer," i.e., a metal wire for connecting several semiconductor devices together. BEOL generally includes fabrication processes following the formation of the first metal layer, including the formation of all subsequent metal layers. To provide greater scaling and sophistication of the fabricated device, the number of metal layers can be varied to suit a particular application, e.g., by providing four to six metal layers, or as many as, in a further example, sixteen or more metal layers.

As the total number of devices in each IC product continues to increase, the resilience of an IC structure to side-effects of processing and/or general wear has become increasingly significant. For example, the separation of metal layers from one another (i.e., delamination) during a dicing process can become significant where cracks form at the perimeter edge of a product and propagate toward the devices included therein. Even where dummy materials (sometimes known as "crack stops") are formed near the perimeter edge of a manufactured device to prevent or slow the growth of a crack, a formed crack may nevertheless circumvent the crack stop in some instances.

SUMMARY

A first aspect of the disclosure provides an integrated circuit (IC) structure including: an insulator positioned over a device layer; a capping layer positioned over the insulator; an inter-layer dielectric (ILD) positioned over the capping layer; a first metal wire positioned over the ILD, and outside an active area of the IC structure; a continuous metal crack stop in contact with, and interposed between, the first metal wire and the device layer, such that the continuous metal crack stop extends through at least the insulator, the capping layer, and the ILD; a second metal wire positioned over the ILD, and within the active area of the IC structure; and at least two vias vertically coupled to each other and interposed between the second metal wire and the device layer, such that the at least two vias extend through at least the insulator, the capping layer, and the ILD, wherein the at least two vias are positioned laterally inward of the continuous metal crack stop.

A second aspect of the disclosure provides an integrated circuit (IC) structure including: a device layer including a plurality of transistor structures; an insulator positioned over the device layer; a capping layer positioned over the insulator; an inter-layer dielectric (ILD) positioned over the capping layer; a first metal wire positioned over the ILD, and outside an active area of the IC structure; a continuous metal crack stop in contact with, and interposed directly between, the first metal wire and a first transistor structure of the plurality of transistor structures in the device layer, such that the continuous metal crack stop extends through the insulator, the capping layer, and the ILD, wherein the continuous metal crack stop is positioned proximate a perimeter edge of the IC structure; a second metal wire positioned over the ILD, and within the active area of the IC structure; and at least two vias vertically coupled to each other and interposed between the second metal wire and one of the plurality of transistor structures of the device layer, such that the at least two vias extend through at least the insulator, the capping layer, and the ILD, wherein the at least two vias are positioned laterally inward of the continuous metal crack stop.

A third aspect of the disclosure provides an integrated circuit (IC) structure including: a buried insulator layer positioned on a semiconductor substrate; a device layer including a plurality of transistor structures positioned over the buried insulator layer; an insulator positioned over the device layer; a capping layer positioned over the insulator; an inter-layer dielectric (ILD) positioned over the capping layer; a first metal wire positioned over the ILD, and outside an active area of the IC structure; a continuous metal crack stop in contact with, and interposed directly between, the first metal wire and the buried insulator layer, such that the continuous metal crack stop extends through the device layer, the insulator, the capping layer, the ILD, and into at least a portion of the buried insulator layer, wherein the continuous metal crack stop is positioned proximate a perimeter edge of the IC structure; a second metal wire positioned over the ILD, and within an active area of the IC structure; and at least two vias vertically coupled to each other and interposed between the second metal wire and one of the plurality of transistor structures of the device layer, such that the at least two vias extend through the insulator, the capping layer, and the ILD, wherein the at least two vias are positioned laterally inward of the continuous metal crack stop.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Embodiments of the present disclosure provide integrated circuit (IC) structures with a metal crack stop, including structures for impeding or altogether preventing delamination cracks from propagating away from a perimeter edge of the IC to active devices therein. Among other things, IC structures according to the present disclosure can include a continuous metal crack stop proximate a perimeter edge of an IC, which may be distinct from other crack stop regions in the IC. Embodiments of the present disclosure can protect against several types of delamination by extending through a group of structural interfaces as discussed herein.

Figure 1:
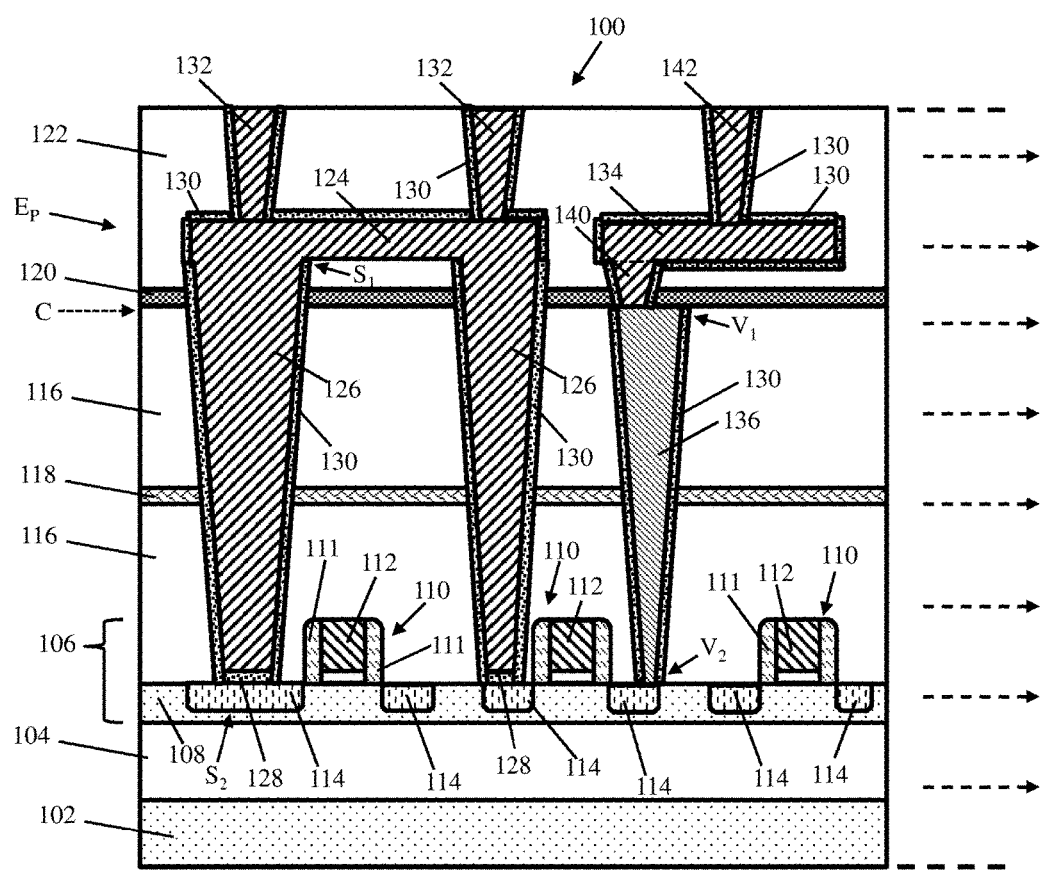
FIG. 1 shows a cross-sectional view of an IC structure with a continuous metal crack stop over a source/drain region, according to embodiments.
Figure 2:
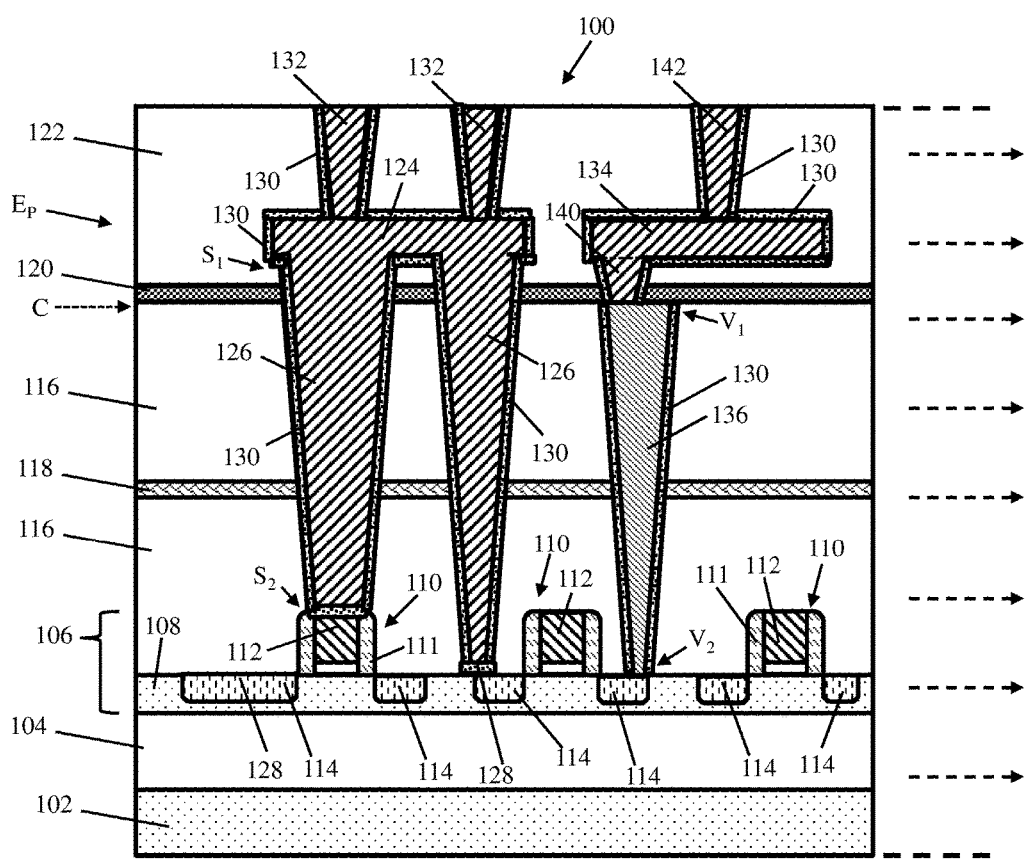
FIG. 2 shows a cross-sectional view of an IC structure with a continuous metal crack stop over a gate metal, according to embodiments.

Referring to FIGS. 1 and 2 together, embodiments of IC structure 100 according to the disclosure are shown. Structure 100 can include or otherwise be positioned over a substrate 102 including one or more semiconductor materials therein. More specifically, substrate 102 can be composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained.

A buried insulator layer 104, also known in the art as a "buried oxide layer" or "BOX" layer, can be formed on and positioned above substrate 102. Buried insulator layer 104 may be composed of any insulating material such as $SiO_2$, SiN, porous $SiO_x$, and/or doped $SiO_x$, and other currently known or later developed materials having similar properties. Buried insulator layer 104 may be positioned directly beneath a device layer 106. Device layer 106 may include a silicon-on-insulator (SOI) layer 108 provided as a layer of semiconductive material, and in which one or more transistor structures 110 and a surrounding dielectric 111 (e.g., sidewall spacers) may be formed. It is understood that embodiments of the present disclosure may be formed in and/or proximal to portions of device layer 106 without transistor structures 110 formed therein. According to an example, buried insulator layer 104 can include a layer of silicon oxide ($SiO_2$) positioned beneath device layer at a depth ranging from, e.g., between approximately one-hundred nanometers (nm) to approximately four micrometers (μm) from device layer 106 depending on application. The thickness of buried insulator layer 104 may be between, e.g., approximately 40 nm to approximately 100 nm. SOI layer 108 can also include, e.g., shallow trench isolations (STIs) (not shown) positioned laterally between discrete elements of device layer 106. Such STI(s) can be formed from one or more regions of insulating material, and may be formed by removing portions of SOI layer 108 to form trenches and then filling the trenches with an electrically insulative material, e.g., one or more of the insulating materials described elsewhere herein. STI(s) within device layer 106 are omitted from the accompanying FIGS. solely for clarity of illustration.

Each transistor structure 110 of device layer 106 can include, e.g., a gate metal 112 and corresponding source/drain regions 114 formed in SOI layer 108. Gate metal 112 can include one or more conductive metals found in conventional device structures, e.g., polysilicon, titanium nitride (TiN), tungsten (W), etc. Applying a voltage to gate metal 112 can affect the function of its corresponding transistor structure 110, e.g., by forming a conductive channel between source/drain regions 114. Source/drain regions 114 can include one or more semiconductor materials included as part of layer 108, and may include one or more dopants therein to yield varying electrical conductivity. A "dopant" material or materials introduced by "doping" generally refers to foreign materials added to a structural component to alter its electrical properties, e.g., resistivity and/or conductivity. As noted herein, conductive materials and/or semiconductive materials may include dopant compounds introduced, e.g., by any currently-known or later developed technique for introducing materials to the composition of a structure. Source/drain regions 114 may also be rendered electrically conductive by way of silicide formation. Silicide materials can be formed within source/drain regions 114 using any now known or later developed technique, e.g., performing an in-situ pre-clean, and depositing a metal such as titanium (Ti), nickel (Ni), cobalt (Co), molybdenum (Mo), etc., on portions of SOI layer 108. Thereafter, the deposited metal can be annealed to cause the metal to react with SOI layer 108. Any unreacted portions of the deposited metal may be removed, e.g., by additional etching. The resulting source/drain regions 114 can have a higher electrical conductivity than a remainder of SOI layer 108, by virtue of having conductive metals therein, after the annealing. Although transistor structures 110 are shown by example to be in the form of metal oxide semiconductor field effect transistors (MOSFETs), IC structure 100 can include any other currently-known or later developed transistor structure in device layer 106. For example, one or more transistor structures 110 may be embodied as FinFET transistors including a fin-shaped portion of SOI layer 108 to define source/drain regions 114, and with gate metal 112 formed on an at least an upper surface thereof. As noted elsewhere herein, embodiments of the present disclosure can be formed within and/or include portions of device layer 106 without transistor structures 110.

Device layer 106 can also include an insulator 116 positioned over SOI layer 108 and/or transistor structures 110, where applicable. In addition, insulator 116 can be positioned over device layer 106 to provide electrical insulation and physical separation between components of device layer 106 and overlying elements. Insulator 116 may include any currently-known or later developed material for providing electrical insulation. The insulating quality of a material may be characterized by "k," the dielectric constant. For example, insulator 116 may be composed of any insulating material such as $SiO_2$ or a "high-k" dielectric having a high dielectric constant (where "k" denotes the material's dielectric constant), which may be, for example, above 3.9. In some situations, insulator 116 may be composed of an oxide substance. Insulator 116 can initially be formed as a single, continuous layer or group of insulating layers, each of which can be separately processed to include trenches, cavities, etc. Materials appropriate for the composition of insulator 116 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties. The insulating quality of a material may be characterized by "k," the dielectric constant. For example, insulator 116 may be composed of any insulating material such as $SiO_2$ or a "high-k" dielectric having a high dielectric constant (where "k" denotes the material's dielectric constant), which may be, for example, above 3.9. In some situations, insulator material 104 may be composed of an oxide substance. As is known in the art, the properties of insulator 116, including the magnitude of each layer's dielectric constant for each layer, can allow for different types of layers to serve as, e.g., a "high-k" layer, a "low-k" layer, an "ultra low-k" layer, etc.

Structure 100 can, optionally, include at least one nitride region 118 (e.g., a middle of line (MOL) nitride) extending laterally through insulator 116. Nitride region 118 can have electrically insulating properties, similar to a remainder of insulator 116, yet can include a different chemical composition. More specifically, nitride region 118 can be composed of a material with a greater resistance to wet etching than a remainder of insulator 116, as discussed elsewhere herein. Where insulator 116 includes a nitride material, nitride region 118 can be composed of a different nitride material with a greater ability to resist structural modification (e.g., various forms of etching during fabrication) than insulator 116.

Structure 100 can include a capping layer 120 formed over insulator 116, and/or other elements of structure 100 where applicable. An interlayer dielectric (ILD) 122, in turn, can be formed over capping layer 120. Capping layer 120 can be embodied as any currently known or later developed "low-k" insulating or dielectric material, such as one or more of those discussed herein with respect to insulator 116. Capping layer 120 can be adapted to insulate adjacent metal-level layers of in an integrated circuit, and can have a dielectric constant of at most approximately 3.9, e.g., the dielectric constant of silicon dioxide ($SiO_2$). Where capping layer 120 includes a low-k material, the properties of capping layer 120 can reduce or prevent interlayer conductivity, i.e., "cross talk" between adjacent layers. ILD 122, also known as an "inter-metal dielectric" or "inter-level dielectric," can include any dielectric material capable of electrically separating closely spaced interconnect lines positioned in multilevel metallization regions of an IC. ILD 122 can be composed of a material with a lower dielectric constant than capping layer 120, and in an embodiment can be composed of a material having a dielectric constant between approximately 1.0 and approximately 2.0, or in any event less than approximately 3.9. Multiple capping layers 120 and ILDs 122 can be alternatingly positioned over insulator 116, e.g., through BEOL processing of an IC structure.

Structure 100 can include a first metal wire 124 positioned over ILD 122 to electrically couple connect different circuit elements to each other as discussed herein. First metal wire 124 may be embedded within ILD 122, e.g., above capping layer 120 and below additional layers, structures, etc., positioned above ILD 122. First metal wire 124 can be formed, e.g., by removing one or more portions of ILD 122 and forming first metal wire 124 in the removed portions by deposition and/or other processes of forming an IC material. Processes of forming first metal wire 124 can also include forming only part of ILD 122 to a preliminary thickness, depositing a layer of metal on the partially formed ILD 122, patterning and removing portions of the deposited metal to define first metal wire 124, and thereafter forming the rest of ILD 122. First metal wire 124 may include, e.g., one or more conductive metals including copper (Cu), aluminum (Al), manganese (Mn), cobalt (Co), etc., and may also include composite materials formed from such metals (e.g., metallic compounds, alloys, etc.). First metal wire 124 may be positioned outside an active area of structure 100, e.g., where functional transistors or other electrically active components of device layer 106 are positioned. More specifically, can be positioned laterally outside of the active area of structure 100 and device layer 106.

Structure 100 can include a continuous metal crack stop 126 interposed directly between first metal wire 124 and source/drain region 114, which may include a nitride etch stop 128. FIG. 2 illustrates an embodiment where one or more continuous metal crack stops 126 may be positioned over device layer 106, e.g., on gate metal 112, and/or on nitride etch stop 128 where applicable. As used herein a "continuous" structure (e.g., continuous metal crack stop(s) 126) may be distinguished from non-continuous structures by lacking differences in material composition, crystallographic orientation, and/or other structural properties along the boundary between two adjacent layers of material, and/or elsewhere within the structure. Thus, continuous metal crack stop(s) 126 can extend continuously from a first end $S_1$ within ILD 122 to a second end $S_2$ within or below device layer 106 without including any structural discontinuities (e.g., differences in composition, material interfaces, etc.) therebetween. To provide these structural characteristics, continuous metal crack stop 126 can be formed, e.g., by way of selective removing, etching, etc., followed by a single metal fill, deposition, and/or other process for forming a material which extends through multiple distinct layers. Continuous metal crack stop 126 can be formed before metal wire 124, or may be formed as a result of the same process applied to form metal wire 124. Continuous metal crack stop 126 can be formed, e.g., by forming an opening within insulator 116, nitride region 118 (where applicable), and ILD 122 to device layer 106, e.g., at gate metal 112 source/drain region 114, or, optionally, nitride etch stop 128, and forming a metal within the opened materials by any currently known or later developed process of forming a substantially planarized metal on an IC structure, e.g., successive deposition and polishing. As shown, and discussed elsewhere herein, continuous metal crack stop 126 can be sized to have an equivalent height of two or more vertically connected vias positioned in other portions of IC structure 100.

During stress events such as the dicing of chips from a larger structure, delamination cracks traveling horizontally from perimeter edge $E_P$ of structure 100, e.g., along line C at an interface between capping layer 120 and ILD 122, or between capping layer 120 and insulator 116, can be laterally stopped upon reaching continuous metal crack stop 126. That is, delamination cracks propagating along these interfaces would hit a continuous wall of metal and will meet no horizontal interface through which the crack can propagate to the other side of continuous metal crack stop 126. Cracks would therefore need to move vertically upwards or downwards along continuous metal crack stop 126 in order to reach another horizontal interface for continued lateral propagation intro structure 100. As shown, continuous metal crack stop 126 extends vertically through several horizontal interfaces in structure 100, e.g., between: capping layer 120 and ILD 122, capping layer 120 and insulator 116, nitride region 118 and other portions of insulator 116 (where applicable), components of device layer 106 (e.g., source/drain region(s) 114 or gate metal(s) 122) and insulator 116. This characteristic of continuous metal crack stop 126 can be provided, e.g., as a result of having a greater height than other vias in structure 100.

In embodiments where nitride etch stop 128 is included, the position of nitride etch stop 128 beneath second end $S_2$ of continuous metal crack stop 126 can further impede crack propagation below continuous metal crack stop 126, in addition to providing structural and/or electrical separation between continuous metal crack stop 126 and underlying elements. In addition to the various structural features discussed herein, continuous metal crack stop 126 may be distinguished from a conventional through-semiconductor via (TSV), i.e., a via extending through semiconductor material to allow wafer-to-wafer interconnect structures, by being in contact with nitride etch stop 128 and/or including second end $S_2$ within distinct structures. More specifically, second end $S_2$ can be embedded at least partially within gate metal 112, source/drain region 114, and/or other components below insulator 116 (e.g., buried insulator layer 104) without being substantially coplanar with an existing horizontal interface between two other elements.

Figure 3:
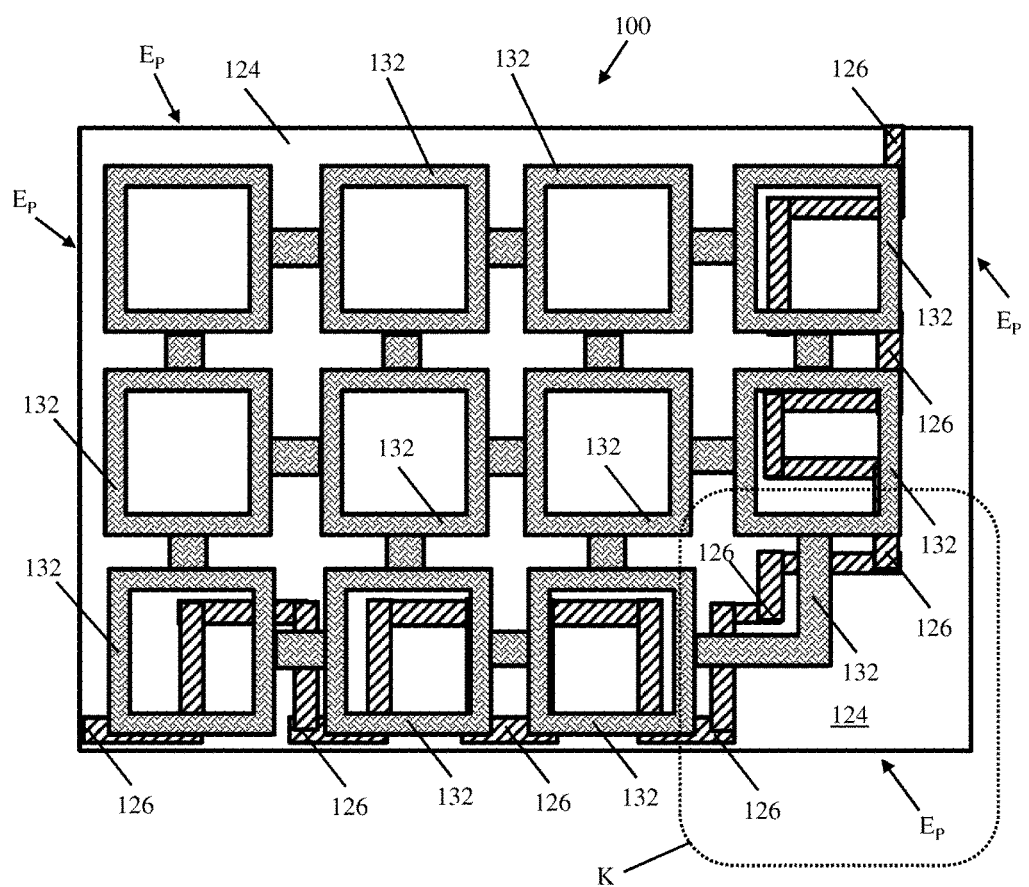
FIG. 3 shows a plan view of an IC structure with a continuous metal crack stop, according to embodiments.

Referring to FIG. 3, a plan view of structure 100 with continuous metal crack 126 is shown to illustrate the relative position of continuous metal crack stop 126 and perimeter edges $E_P$ of structure. 100. The portions of structure 100 depicted in FIG. 3 can represent an inactive area of an IC structure, e.g., without electrically functional devices included therein. Some elements in FIG. 3 are show with different forms of cross-hatching, relative to other FIGS., to better illustrate the vertical position of some components relative to others. As discussed herein, first metal wire 124 can be positioned beneath several vias 132, while continuous metal crack stop 126 can extend below first metal wire 124 to underlying structures. Referring briefly to FIGS. 1-2, continuous metal crack stop(s) 126 may extend laterally into and out of the plane of the page in some applications, as demonstrated in FIG. 3. Continuous metal crack stop(s) 126 can substantially line one or more perimeter edges $E_P$ of structure 100 in portions below first metal wire 124. As shown, continuous metal crack stop 126 may be positioned within a corner K of structure 100 where two perimeter edges $E_P$ intersect each other. structure 100 can include one or more first metal wires 124 and continuous metal crack stops 126 which include the same material composition (e.g., copper (Cu), aluminum (Al), zinc (Zn) and/or other conductive metals), and more specifically may alternatively be embodied as different regions of a unitary element in structure 100. First metal wire 124 and continuous metal crack stops 126 may therefore be structurally continuous with each other. First metal wire 124 and continuous metal crack stop 126 may be embodied as parts of a single, larger structure by being formed together (e.g., by deposition) as discussed elsewhere herein. In alternative embodiments, continuous metal crack stop 126 may not be coincident with and/or proximal to vias 132.

Returning to FIGS. 1-2, structure 100 can optionally include a nitride etch stop 128 included in device layer 106 and positioned, e.g., on an upper surface of gate metal 112 (FIG. 2 only), source/drain region(s) 114 (FIGS. 1-2). An "etch stop" generally refers to any material which exhibits a reduced susceptibility to etching relative to overlying materials. Here, nitride and/or other IC materials including nitrogen therein may be formed to prevent further removal of materials below the position of nitride etch stop 128. In further embodiments, nitride etch stop 128 may be positioned in other structures below device layer 106, e.g., buried insulator layer 104. In an example embodiment nitride etch stop 128 can be composed of a pure nitride layer positioned on device layer 106 and/or other portions of structure 100. As discussed elsewhere, nitride etch stop 128 can include additional or alternative materials, e.g., one or more substances including nitrogen to prevent materials positioned below nitride etch stop 128 from being removed during fabrication. Nitride etch stop 128 can be formed, e.g., by one or more deposition processes including chemical vapor deposition (CVD), plasma-enhanced chemical vapor deposition (PECVD), and atomic layer deposition (ALD), etc. Upon being formed, nitride etch stop 128 may have a thickness in the range of between approximately two nanometers (nm) and approximately five nm.

A liner 130, including refractory metal compounds such as a tantalum nitride (TaN) and/or tantalum (Ta), can be formed conformally upon portions of device layer 106, insulator 116, nitride region 118 (where applicable), capping layer 120, and/or ILD 122 before continuous metal crack stop 126 is deposited over device layer 106, e.g., on nitride etch stop 128 and liner 130. Liner 130 in structure 100 may conformally contact continuous metal crack stop 126, e.g., along lateral sidewalls and/or other surfaces thereof, as illustrated. Liner 130 can additionally or alternatively include other refractory metals such as titanium (Ti), tungsten (W), iridium (Ir), rhodium (Rh), cobalt (Co) and platinum (Pt), etc., or mixtures of thereof. In any event, liners 130 can provide structural protection and/or may reduce diffusion of materials from continuous metal crack stop 126 into adjacent materials (e.g., insulator 116). In some embodiments, some of the deposited metal used to form continuous metal crack stop 126 may be positioned on and in contact with ILD 122, e.g., as first metal wire 124.

In structure 100, one or more continuous metal crack stops 126 can be interposed between first metal wire 124 device layer 106, e.g., such that opposing ends $S_1$, $S_2$ of continuous metal crack stop(s) 126 contact first metal wire 124 and device layer 106, respectively. Continuous metal crack stop(s) 126 can extend through at least insulator 116, nitride region 118 (where applicable), capping layer 120, and ILD 122 in structure 100, as shown. At least one continuous metal crack stop 126 may be positioned proximate a perimeter edge $E_P$ (e.g., a lateral edge or sidewall) of structure 100. That is, continuous metal crack stop 126 may not be separated from perimeter edge $E_P$ of structure 100 by one or more laterally intervening elements positioned within and/or extending through insulator 116, nitride region 118 (where applicable), capping layer 120, and ILD 122. As shown, additional continuous metal crack stops 126 may be connected to and/or positioned laterally adjacent to each other between perimeter edge $E_P$ of structure 100 and other structures. Continuous metal crack stop 126 being positioned "proximate" perimeter edge $E_P$ of structure 100 can also include embodiments where continuous metal crack stop 126 is positioned at a lateral separation distance of up to, e.g., approximately one millimeter (mm) from perimeter edge $E_P$ of structure 100. Structure 100 and/or other portions of an IC may continue laterally inward beyond the portions illustrated in the accompanying FIGS., as indicated by phantom lines and arrows shown opposite perimeter edge $E_P$.

To provide an electrical connection between device layer 106 and other metal wires through continuous metal crack stop 126, one or more connecting vias 132 may be positioned between first metal wire 124 and other structures positioned above ILD 122. Connecting vias 132 may be formed from one or more conductive metals, e.g., one or more substances included in first metal wire 124 and/or continuous metal crack stop(s) 126. Liners 130 may also be positioned between connecting via(s) 132 and ILD 122, similar to continuous metal crack stop 126. In addition to continuous metal crack stop(s) 126 positioned, e.g., proximate perimeter edge $E_P$, structure 100 can include a second metal wire 134 and at least two vias 136, 140 disposed laterally inward relative to continuous metal crack stop(s) 126. Second metal wire 134 can be distinguished from first metal wire 124, e.g., by being positioned in an active area of structure 100. As discussed elsewhere herein, second metal wire 124 can be electrically coupled to active transistors and/or other components of device layer 106. Liners 130 may also be formed on exterior surfaces of first and second metal wires 124, 134, as illustrated. Second metal wire 134 can be coupled to at least two vias 136, 140, which can be positioned on and/or within a portion of ILD 122 to connect second metal wire 134 to active components of device layer 106, e.g., transistor(s) 110. Each via 136 may have one or more liners 130 conformally coating sidewalls and/or other portions of via 136. Vias 136 140 can each extend through respective components, e.g., insulator 116 and nitride region 118 (where applicable), such that one via 136 contacts another via 140 at end $V_1$, and contacts source/drain region 114 of device layer 106 at its opposing end $V_2$. Via 136 may be positioned over and in contact with gate metal 112 of device layer 106 in alternative embodiments. Via 140 can be vertically coupled to via 136 and second metal wire 134, e.g., by being positioned directly vertically therebetween. As shown, an upper surface of via 136 may be substantially coplanar with a horizontal interface between capping layer 120 and insulator 116, or a horizontal interface between capping layer 120 and ILD 122. Via 140 may be positioned between second metal wire 134 and vias 136, 140 and may include, e.g., the same material composition as second metal wire 134 and/or other conductive metals. In some cases, via 140 may be formed together with second metal wire 134 as part of a single fabrication process (e.g., damascene formation) and may be structurally continuous with second metal wire 134. Regardless, vias 136, 140 each have an individual height less than that of continuous metal crack stop 126.

Vias 136, 140 can be composed of any currently known or later developed conductive material. In particular, vias 136, 140 can include one or more materials used to form first metal crack stop 126, or may include a different material. Vias 136, 140 may include tungsten (W) or metals, compounds, alloys, etc., with similar properties. Vias 136, 140 can also include multiple sub-sections therein. Vias 136, 140 can be formed, e.g., simultaneously with continuous metal crack stop 126 using a shared deposition and polishing process, or sequentially after continuous metal crack stop 126 using a separate deposition and polishing process. Although continuous metal crack stop 126 can reduce the propagation of delamination cracks as discussed herein, both continuous metal crack stop(s) 126 and via(s) 136 can transmit electric current between layers of an IC structure as discussed herein. One or more connecting vias 142 can electrically couple second metal wire 134 and its corresponding vias 136, 140 to elements formed on structure 100 as discussed elsewhere herein relative to connecting vias 132. Liners 130 may also be positioned between connecting via(s) 142 and ILD 122, similar via(s) 136.

Figure 4:
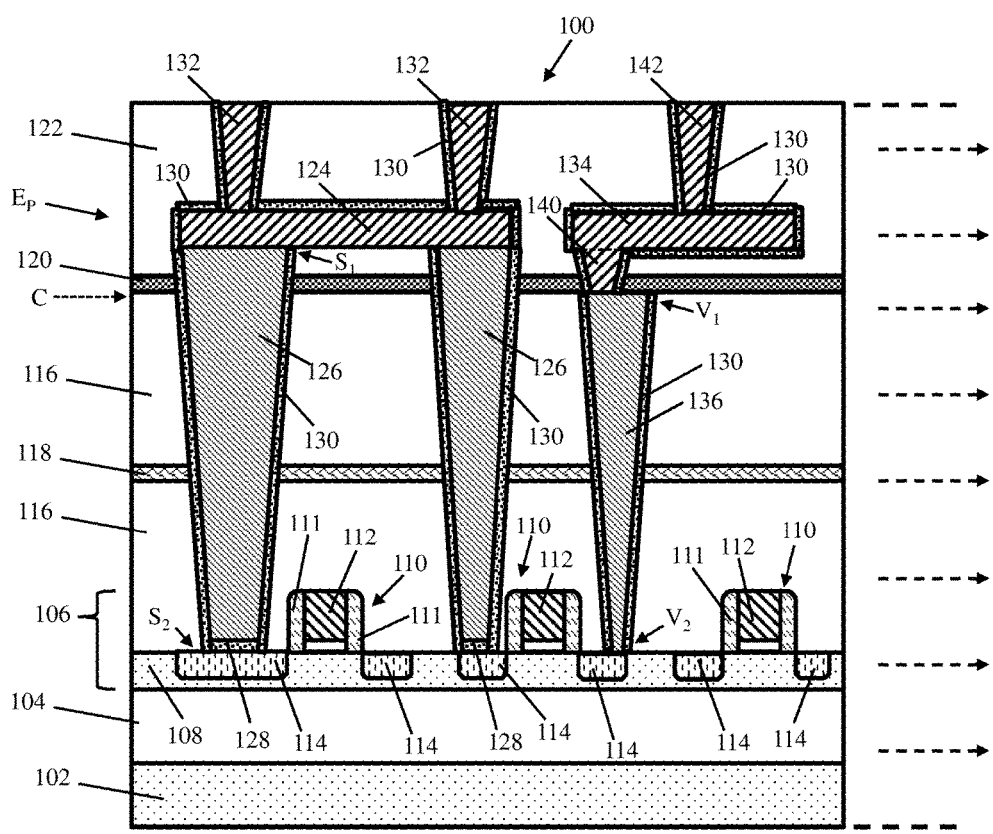
FIG. 4 shows a cross-sectional view of another IC structure with a continuous metal crack stop over a source/drain region, according to embodiments.
Figure 5:
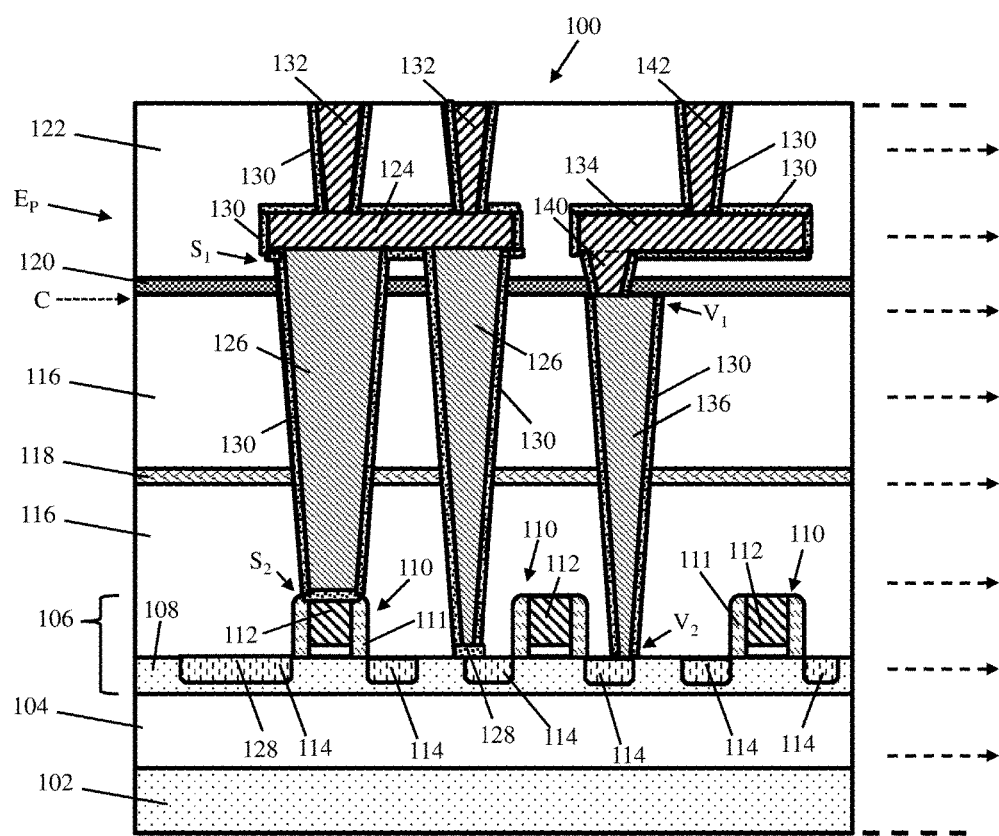
FIG. 5 shows a cross-sectional view of another IC structure with a continuous metal crack stop over a gate metal, according to embodiments.

Turning to FIGS. 4-5, structure 100 can also include continuous metal crack stops 126 with a different material composition from that of first metal wire 124. In particular, continuous metal crack stops 126 can include tungsten (W) and/or other metals which may form part of vias 136, 140. Nevertheless, continuous metal crack stops 126 can extend through ILD 122, capping layer 120, insulator 116, and nitride region 118 where applicable. Regardless of the material composition of continuous metal crack stops 126, an upper surface of each continuous metal crack stop 126 can contact first metal wire 124 while a lower surface of each continuous metal crack stop 126 can contact device layer 106, e.g., at nitride etch stop 128. FIG. 4 illustrates continuous metal crack stop 126 positioned over nitride etch stop 128 on source/drain region 114. FIG. 5 illustrates continuous metal crack stop 126 positioned over nitride etch stop 128 on gate metal 112. Modified compositions of one or more continuous metal crack stops 126, e.g., as shown in FIGS. 4-5, may be suitable for accommodating varied fabrication techniques and/or mechanical or electrical performance requirements for each element of structure 100.

Figure 6:
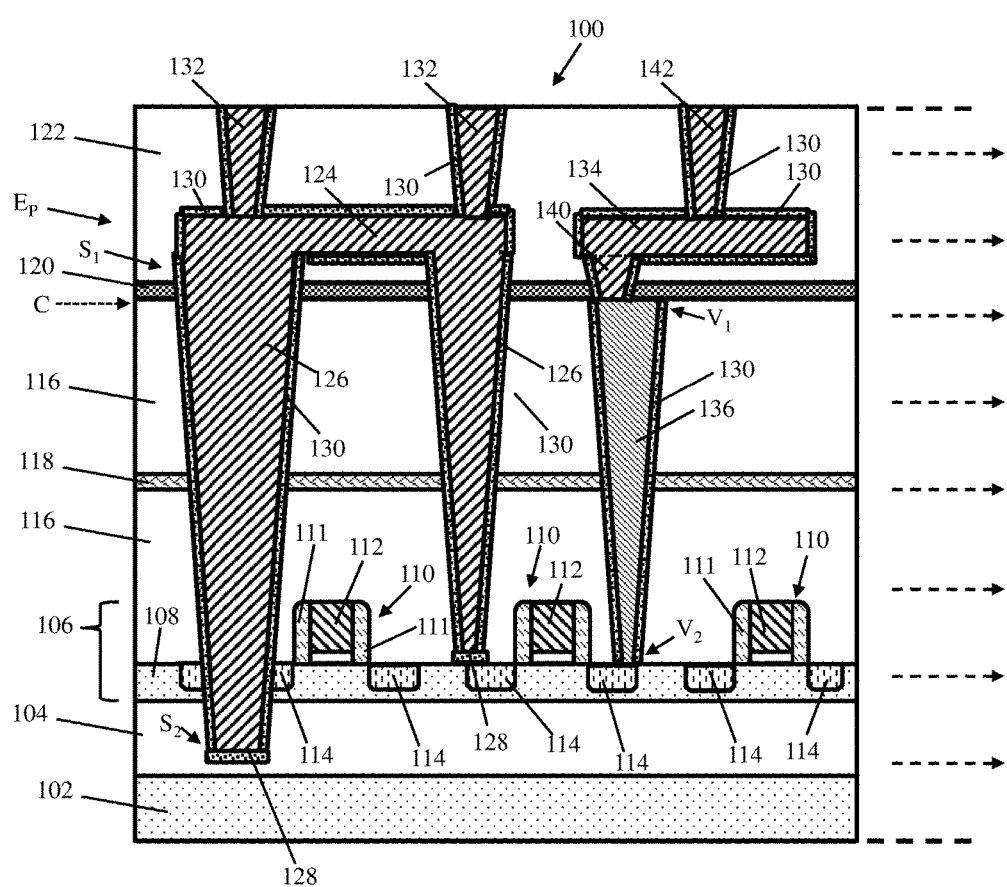
FIG. 6 shows a cross-sectional view of an IC structure with a continuous metal crack stop over a buried insulator layer, according to embodiments.
Figure 7:
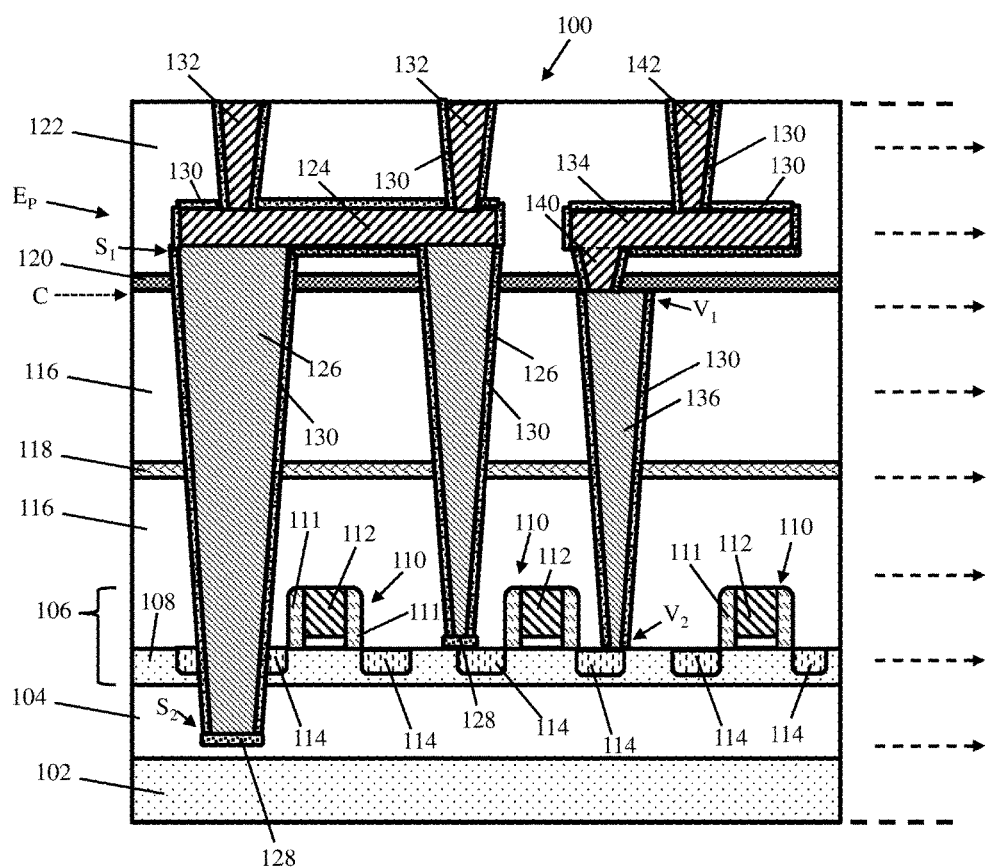
FIG. 7 shows a cross-sectional view of another IC structure with a continuous metal crack stop over a buried insulator layer, according to embodiments.

Turning to FIGS. 6-7, structure 100 may include additional or alternative positions for continuous metal crack stop 126 and nitride etch stop 128. As shown, nitride etch stop 128 may be positioned on a portion of buried insulator layer 104, beneath device layer 106. Thus, continuous metal crack stop 126 can extend completely through device layer 106 and at least part of buried insulator layer 104, in addition to extending through insulator 116, nitride region 118, capping layer 120, and ILD 122. One or nitride etch stops 128 can be positioned on buried insulator layer 104 and beneath device layer 106, as shown, while others may be positioned on source/drain region(s) 114 of device layer 106 as discussed elsewhere herein. In any event, continuous metal crack stop(s) 126 extending through device layer 106 may be positioned proximate perimeter edge $E_P$ of structure 100 as discussed elsewhere herein. Regardless of placement, continuous metal crack stop 126 can have varying compositions in IC structure 100. FIG. 6 illustrates continuous metal crack stop 126 with a same material composition as first metal wire 124, such that first metal wire 124 and continuous metal crack stop 126 form sub-portions of a single structure as described herein. FIG. 7 illustrates continuous metal crack stop 126 with a different material composition from that of first metal wire 124 yet extending through the same components, regions, etc., of IC structure 100. In such arrangements, continuous metal crack stop 126 may include tungsten (W) and/or other materials used to form vias 136, 140. A user of structure 100 may desire to form one or more continuous metal crack stops 126 from tungsten and/or other materials different from first metal wire 124 to accommodate fabrication requirements, preferences, etc., for other portions of IC structure 100 and/or other components formed as part of a single unit.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
an insulator positioned over a device layer;
a capping layer positioned over the insulator;
an inter-layer dielectric (ILD) positioned over the capping layer;
a first metal wire positioned over the ILD, and outside an active area of the IC structure;
a continuous metal crack stop in contact with, and interposed between, the first metal wire and the device layer, such that the continuous metal crack stop extends through at least the insulator, the capping layer, and the ILD, wherein the continuous metal crack stop is substantially free of structural discontinuities;
a second metal wire positioned over the ILD, and within the active area of the IC structure; and
at least two vias vertically coupled to each other and interposed between the second metal wire and the device layer, such that the at least two vias extend through at least the insulator, the capping layer, and the ILD, wherein the at least two vias are positioned laterally inward of the continuous metal crack stop.

2. The IC structure of claim 1, wherein the first metal wire, the second metal wire, and the continuous metal crack stop each include a same material composition.

3. The IC structure of claim 2, wherein the first metal wire, the second metal wire, and the continuous metal crack stop are structurally continuous with each other and formed in a single metallization process.

4. The IC structure of claim 1, wherein the continuous metal crack stop comprises tungsten (W).

5. The IC structure of claim 1, further comprising a nitride etch stop contacting and overlying the device layer.

6. The IC structure of claim 1, wherein a horizontal interface between the capping layer and the insulator intersects a sidewall of the continuous metal crack stop.

7. The IC structure of claim 1, further comprising a continuous liner material conformally contacting the continuous metal crack stop along sidewalls thereof.

8. The IC structure of claim 1, wherein the continuous metal crack stop is positioned proximate a perimeter edge of the IC structure.

9. The IC structure of claim 1, wherein the continuous metal crack stop contacts and overlies a buried insulator layer positioned below the device layer.

10. An integrated circuit (IC) structure comprising:
a device layer including a plurality of transistor structures;
an insulator positioned over the device layer;
a capping layer positioned over the insulator;
an inter-layer dielectric (ILD) positioned over the capping layer;
a first metal wire positioned over the ILD, and outside an active area of the IC structure;
a continuous metal crack stop in contact with, and interposed directly between, the first metal wire and a first transistor structure of the plurality of transistor structures in the device layer, such that the continuous metal crack stop extends through the insulator, the capping layer, and the ILD, wherein the continuous metal crack stop is positioned proximate a perimeter edge of the IC structure, and wherein the continuous metal crack stop is substantially free of structural discontinuities;
a second metal wire positioned over the ILD, and within the active area of the IC structure; and
at least two vias vertically coupled to each other and interposed between the second metal wire and one of the plurality of transistor structures of the device layer, such that the at least two vias extend through at least the insulator, the capping layer, and the ILD, wherein the at least two vias are positioned laterally inward of the continuous metal crack stop.

11. The IC structure of claim 10, wherein the first metal wire, the second metal wire, and the continuous metal crack stop each include a same material composition, and are structurally continuous with each other.

12. The IC structure of claim 10, wherein the first metal wire, the second metal wire, and the continuous metal crack stop are formed in a single metallization process.

13. The IC structure of claim 10, further comprising a nitride etch stop contacting and overlying the first transistor structure in the device layer at one of a silicide source/drain contact or a gate contact thereof.

14. The IC structure of claim 10, further comprising a continuous liner material conformally contacting the continuous metal crack stop along sidewalls thereof.

15. The IC structure of claim 10, further comprising a continuous liner material C) An integrated circuit (IC) structure comprising:
- a buried insulator layer positioned on a semiconductor substrate;
- a device layer including a plurality of transistor structures positioned over the buried insulator layer;
- an insulator positioned over the device layer;
- a capping layer positioned over the insulator;
- an inter-layer dielectric (ILD) positioned over the capping layer;
- a first metal wire positioned over the ILD, and outside an active area of the IC structure;
- a continuous metal crack stop in contact with, and interposed directly between, the first metal wire and the buried insulator layer, such that the continuous metal crack stop extends through the device layer, the insulator, the capping layer, the ILD, and into at least a portion of the buried insulator layer, wherein the continuous metal crack stop is positioned proximate a perimeter edge of the IC structure, and wherein the continuous metal crack stop is substantially free of structural discontinuities;
- a second metal wire positioned over the ILD, and within an active area of the IC structure; and
- at least two vias vertically coupled to each other and interposed between the second metal wire and one of the plurality of transistor structures of the device layer, such that the at least two vias extend through the insulator, the capping layer, and the ILD, wherein the at least two vias are positioned laterally inward of the continuous metal crack stop.

16. The IC structure of claim 15, wherein the first metal wire, the second metal wire, and the continuous metal crack stop each include a same material composition, and are structurally continuous with each other.

17. The IC structure of claim 15, wherein the first metal wire, the second metal wire, and the continuous metal crack stop are formed in a single metallization process.

18. The IC structure of claim 15, further comprising a continuous liner material conformally contacting the continuous metal crack stop along sidewalls thereof.

19. The IC structure of claim 10, wherein the continuous metal crack stop contacts and overlies a buried insulator layer positioned below the device layer.

20. The IC structure of claim 15, wherein the continuous metal crack stop contacts and overlies a buried insulator layer positioned below the device layer.

* * * * *